US011751337B2

(12) United States Patent
Baker et al.

(10) Patent No.: US 11,751,337 B2
(45) Date of Patent: Sep. 5, 2023

(54) WIRELESS POWER OF IN-MOLD ELECTRONICS AND THE APPLICATION WITHIN A VEHICLE

(71) Applicant: Honda Motor Co., Ltd., Tokyo (JP)

(72) Inventors: Alex W. Baker, Ostrander, OH (US); Zainab I. Ali, Marysville, OH (US)

(73) Assignee: HONDA MOTOR CO., LTD., Tokyo (JP)

( * ) Notice: Subject to any disclaimer, the term of this patent is extended or adjusted under 35 U.S.C. 154(b) by 385 days.

(21) Appl. No.: 16/821,568

(22) Filed: Mar. 17, 2020

(65) Prior Publication Data

US 2020/0343770 A1    Oct. 29, 2020

Related U.S. Application Data

(60) Provisional application No. 62/839,461, filed on Apr. 26, 2019.

(51) Int. Cl.
*H05K 3/28* (2006.01)
*H02J 50/12* (2016.01)
(Continued)

(52) U.S. Cl.
CPC ....... *H05K 3/284* (2013.01); *B29C 45/14336* (2013.01); *F21S 43/14* (2018.01);
(Continued)

(58) Field of Classification Search
CPC ..................................................... H05K 3/284
See application file for complete search history.

(56) References Cited

U.S. PATENT DOCUMENTS 3,049,077 A    8/1962   Damm, Jr.
3,075,280 A    1/1963   Jack et al.
(Continued)

FOREIGN PATENT DOCUMENTS

AT    519037    3/2018
AT    519702    9/2018
(Continued)

OTHER PUBLICATIONS

Office Action of U.S. Appl. No. 16/857,548 dated Oct. 22, 2020, 48 pages.

(Continued)

*Primary Examiner* — Rafferty D Kelly
(74) *Attorney, Agent, or Firm* — RANKIN, HILL & CLARK LLP

(57) ABSTRACT

A functional vehicle component and related methods include a transmitter coil and a molded part. The molded part includes a first thermoformed film, a molded polymeric structural layer arranged under the film, a printed electronic circuit arranged under the film and adjacent the structural layer, an optional second thermoformed film, and graphics on the first film. The electronic circuit includes a receiver coil, conductive traces, and electronic elements. The first film is arranged to cover the polymeric structural layer and the electronic circuit to thereby define an exposed surface of the molded part. The first film and/or the graphics camouflages the circuit. The transmitter coil is connected to an external power source, and is arranged on the molded part such that the receiver coil is inductively coupled to the transmitter coil so as to wirelessly power the electronic elements of the circuit.

9 Claims, 7 Drawing Sheets

(51) Int. Cl.
*F21S 43/14* (2018.01)
*H05K 1/16* (2006.01)
*H05K 1/18* (2006.01)
*B29C 45/14* (2006.01)
*B29L 31/34* (2006.01)

(52) U.S. Cl.
CPC .............. *H02J 50/12* (2016.02); *H05K 1/165* (2013.01); *H05K 1/181* (2013.01); *B29L 2031/3425* (2013.01); *H05K 2201/10106* (2013.01); *H05K 2201/10151* (2013.01); *H05K 2203/1316* (2013.01); *H05K 2203/1327* (2013.01)

(56) References Cited

U.S. PATENT DOCUMENTS

| | | |
|---|---|---|
| 3,391,846 A | 7/1968 | White |
| 3,549,304 A | 12/1970 | Ebel et al. |
| 4,964,674 A | 10/1990 | Altmann et al. |
| 5,002,335 A | 3/1991 | Bengtsson |
| 5,622,652 A | 4/1997 | Kucherovsky et al. |
| 5,624,736 A | 4/1997 | DeAngelis et al. |
| 5,763,058 A | 6/1998 | Isen et al. |
| 5,843,263 A | 12/1998 | Mitchell |
| 5,948,297 A | 9/1999 | Haubner et al. |
| 6,106,920 A | 8/2000 | Pichon et al. |
| 6,311,350 B1 | 11/2001 | Kaiserman et al. |
| 6,345,839 B1 | 2/2002 | Kuboki et al. |
| 6,371,604 B1 | 4/2002 | Yamane et al. |
| 6,395,121 B1 | 5/2002 | De Bastiani |
| 6,545,236 B2 | 4/2003 | Valk et al. |
| 6,579,593 B1 | 6/2003 | Mori et al. |
| 6,607,681 B1 | 8/2003 | Ito et al. |
| 6,652,128 B2 | 11/2003 | Misaras |
| 6,697,694 B2 | 2/2004 | Mogensen |
| 6,729,025 B2 | 5/2004 | Farrell et al. |
| 6,820,897 B2 | 11/2004 | Breed et al. |
| 6,868,934 B2 | 3/2005 | Dirrig |
| 7,301,351 B2 | 11/2007 | Deangelis et al. |
| 7,395,717 B2 | 7/2008 | DeAngelis et al. |
| 7,432,459 B2 | 10/2008 | Stoschek et al. |
| 7,516,809 B2 | 4/2009 | Hetzenecker et al. |
| 7,710,279 B1 | 5/2010 | Fields |
| 7,719,007 B2 | 5/2010 | Tompkins et al. |
| 7,808,488 B2 | 10/2010 | Martin et al. |
| 7,989,725 B2 | 8/2011 | Boddie et al. |
| 8,114,791 B2 | 2/2012 | Child et al. |
| 8,315,061 B2 | 11/2012 | Ullmann et al. |
| 8,330,079 B2 | 12/2012 | Yasuda et al. |
| 8,463,352 B2 | 6/2013 | Song |
| 8,497,850 B2 | 7/2013 | Foerster et al. |
| 8,506,141 B2 | 8/2013 | Cannon et al. |
| 8,507,102 B1 | 8/2013 | O'Leary |
| 8,552,299 B2 | 10/2013 | Rogers et al. |
| 8,587,422 B2 | 11/2013 | Andrews et al. |
| 8,704,758 B1 | 4/2014 | Figley et al. |
| 8,725,230 B2 | 5/2014 | Lisseman et al. |
| 8,732,866 B2 | 5/2014 | Genz et al. |
| 8,784,342 B2 | 7/2014 | Hyde et al. |
| 8,804,344 B2 | 8/2014 | Moncrieff |
| 8,985,012 B2 | 3/2015 | Yiannakou |
| 8,999,431 B2 | 4/2015 | Nagarajan et al. |
| 9,108,402 B2 | 8/2015 | Sudo et al. |
| 9,112,363 B2 | 8/2015 | Partovi |
| 9,159,221 B1 | 10/2015 | Stantchev |
| 9,180,803 B2 | 11/2015 | Cleary et al. |
| 9,192,031 B2 | 11/2015 | Deyaf |
| 9,210,498 B1 | 12/2015 | Shaffer |
| 9,372,123 B2 | 6/2016 | Li et al. |
| 9,403,460 B2 | 8/2016 | Hickey et al. |
| 9,416,495 B2 | 8/2016 | Depres et al. |
| 9,421,884 B2 | 8/2016 | Boyer et al. |
| 9,448,631 B2 | 9/2016 | Winter et al. |
| 9,481,297 B2 | 11/2016 | Salter et al. |
| 9,554,732 B2 | 1/2017 | Schaffer |
| 9,576,446 B2 | 2/2017 | Zellers |
| 9,672,703 B2 | 6/2017 | Alexiou et al. |
| 9,715,687 B1 | 7/2017 | Lau et al. |
| 9,723,122 B2 | 8/2017 | Ghaffari et al. |
| 9,724,869 B2 | 8/2017 | Niskala et al. |
| 9,800,079 B2 | 10/2017 | Wippler |
| 9,821,680 B2 | 11/2017 | Lange-Mao |
| 9,873,446 B2 | 1/2018 | Gardner et al. |
| 9,875,866 B2 | 1/2018 | Liao et al. |
| 9,886,093 B2 | 2/2018 | Moussette et al. |
| 9,973,021 B2 | 5/2018 | Leabman et al. |
| 10,638,618 B1 | 4/2020 | Teil et al. |
| 2002/0084721 A1 | 7/2002 | Walczak |
| 2002/0104746 A1 | 8/2002 | Valk et al. |
| 2007/0052529 A1 | 3/2007 | Perez |
| 2007/0149001 A1 | 6/2007 | Uka |
| 2007/0236450 A1 | 10/2007 | Colgate et al. |
| 2007/0265738 A1 | 11/2007 | Saito |
| 2008/0157533 A1 | 7/2008 | Flottemesch et al. |
| 2008/0202912 A1 | 8/2008 | Boddie et al. |
| 2008/0257706 A1 | 10/2008 | Haag |
| 2008/0303800 A1 | 12/2008 | Elwell |
| 2009/0004478 A1 | 1/2009 | Baetzold et al. |
| 2009/0061251 A1 | 3/2009 | Kirmeier |
| 2009/0108985 A1 | 4/2009 | Haag et al. |
| 2009/0251917 A1 | 10/2009 | Wollner et al. |
| 2009/0301852 A1 | 12/2009 | Keist et al. |
| 2010/0137702 A1 | 6/2010 | Park et al. |
| 2010/0206614 A1 | 8/2010 | Park et al. |
| 2011/0018498 A1 | 1/2011 | Soar |
| 2011/0209976 A1 | 9/2011 | Krier et al. |
| 2011/0267795 A1 | 11/2011 | Kim et al. |
| 2012/0113667 A1 | 5/2012 | Brandt et al. |
| 2012/0235566 A1 | 9/2012 | Karalis et al. |
| 2013/0126940 A1 | 5/2013 | Simone et al. |
| 2013/0160183 A1 | 6/2013 | Reho et al. |
| 2013/0192412 A1 | 8/2013 | Sekiya et al. |
| 2013/0299598 A1* | 11/2013 | Finn .................. H01Q 1/2283 29/601 |
| 2014/0022070 A1 | 1/2014 | Golomb |
| 2014/0036428 A1 | 2/2014 | Leong et al. |
| 2014/0054919 A1 | 2/2014 | Oeuvrard et al. |
| 2014/0084045 A1 | 3/2014 | Yang et al. |
| 2014/0109719 A1 | 4/2014 | Lisseman et al. |
| 2014/0203770 A1 | 7/2014 | Salter et al. |
| 2014/0240132 A1 | 8/2014 | Bychkov |
| 2014/0246415 A1 | 9/2014 | Wittkowski |
| 2014/0265555 A1 | 9/2014 | Hall et al. |
| 2014/0310610 A1 | 10/2014 | Ricci |
| 2014/0354568 A1 | 12/2014 | Andrews et al. |
| 2015/0017421 A1 | 1/2015 | Sotzing |
| 2015/0077969 A1 | 3/2015 | Moncrieff |
| 2015/0175172 A1 | 6/2015 | Truong |
| 2015/0196209 A1 | 7/2015 | Morris et al. |
| 2015/0250420 A1 | 9/2015 | Longinotti-Buitoni et al. |
| 2015/0261264 A1 | 9/2015 | Brown et al. |
| 2015/0288048 A1 | 10/2015 | Tang et al. |
| 2015/0344060 A1 | 12/2015 | Staszak et al. |
| 2015/0352953 A1 | 12/2015 | Koravadi |
| 2015/0375677 A1 | 12/2015 | Salter et al. |
| 2015/0376832 A1 | 12/2015 | Li et al. |
| 2015/0378254 A1 | 12/2015 | Wang et al. |
| 2016/0004362 A1 | 1/2016 | Kring et al. |
| 2016/0007475 A1 | 1/2016 | Zanesi |
| 2016/0042268 A1 | 2/2016 | Puttkammer |
| 2016/0144690 A1 | 5/2016 | Wittkowski et al. |
| 2016/0167130 A1 | 6/2016 | Ida et al. |
| 2016/0218712 A1 | 7/2016 | Ben Abdelaziz |
| 2016/0264078 A1 | 9/2016 | McGuire, Jr. et al. |
| 2016/0272112 A1 | 9/2016 | DeGrazia et al. |
| 2016/0276865 A1 | 9/2016 | Pike et al. |
| 2016/0311366 A1 | 10/2016 | Lisseman |
| 2016/0327979 A1 | 11/2016 | Lettow |
| 2017/0012207 A1 | 1/2017 | Seo et al. |
| 2017/0022379 A1 | 1/2017 | Loccufier et al. |
| 2017/0038795 A1 | 2/2017 | Lettow et al. |
| 2017/0052624 A1 | 2/2017 | Hunt et al. |
| 2017/0061753 A1 | 3/2017 | Khoshkava et al. |

(56) References Cited

U.S. PATENT DOCUMENTS

| | | |
|---|---|---|
| 2017/0092098 A1 | 3/2017 | Alampallam et al. |
| 2017/0101547 A1 | 4/2017 | Loccufier et al. |
| 2017/0126228 A1 | 5/2017 | Gerken et al. |
| 2017/0137050 A1 | 5/2017 | Michelmann et al. |
| 2017/0147106 A1 | 5/2017 | Kwon et al. |
| 2017/0166237 A1 | 6/2017 | Oh et al. |
| 2017/0174124 A1 | 6/2017 | Salter et al. |
| 2017/0291493 A1 | 10/2017 | Bostick et al. |
| 2017/0308778 A1 | 10/2017 | Foerster et al. |
| 2017/0310144 A1 | 10/2017 | Madau et al. |
| 2017/0311666 A1 | 11/2017 | Gladish et al. |
| 2017/0325518 A1 | 11/2017 | Poupyrev et al. |
| 2017/0325524 A1 | 11/2017 | Hyde et al. |
| 2017/0325525 A1 | 11/2017 | Hyde et al. |
| 2017/0326013 A1 | 11/2017 | Hyde et al. |
| 2017/0337462 A1 | 11/2017 | Thiele et al. |
| 2017/0341573 A1 | 11/2017 | Gerhard et al. |
| 2018/0149321 A1 | 5/2018 | Torvinen |
| 2018/0208111 A1 | 7/2018 | Lisseman et al. |
| 2018/0290356 A1 | 10/2018 | Isohätälä et al. |
| 2018/0352661 A1 | 12/2018 | Yang et al. |
| 2019/0001879 A1 | 1/2019 | Ali et al. |
| 2019/0008050 A1 | 1/2019 | Ali et al. |
| 2019/0009812 A1 | 1/2019 | Jendrowski et al. |
| 2019/0077311 A1 | 3/2019 | Ali et al. |
| 2019/0135199 A1 | 5/2019 | Galan Garcia et al. |
| 2020/0192423 A1 | 6/2020 | Hsu et al. |

FOREIGN PATENT DOCUMENTS

| | | |
|---|---|---|
| CN | 1978671 A | 6/2007 |
| CN | 201405914 | 2/2010 |
| CN | 202010160 U | 10/2011 |
| CN | 202138313 | 2/2012 |
| CN | 202765080 | 3/2013 |
| CN | 103618389 | 3/2014 |
| CN | 105196867 | 12/2015 |
| CN | 204926416 | 12/2015 |
| CN | 105507015 | 4/2016 |
| CN | 105951471 | 9/2016 |
| CN | 106663524 | 5/2017 |
| CN | 206948003 U | 1/2018 |
| DE | 2026892 | 12/1971 |
| DE | 102010053354 | 8/2011 |
| DE | 202012004803 | 6/2012 |
| DE | 202013005923 | 7/2013 |
| DE | 202015001403 | 7/2015 |
| DE | 102015200264 | 7/2016 |
| DE | 102015200272 | 7/2016 |
| DE | 102016122074 | 5/2017 |
| DE | 102016202013 | 8/2017 |
| EP | 1580080 | 9/2005 |
| EP | 2628627 | 8/2013 |
| FR | 2937932 | 5/2010 |
| GB | 1313537 | 4/1973 |
| JP | 2000500101 | 1/2000 |
| JP | 2008254485 | 10/2008 |
| JP | 2009018747 | 1/2009 |
| JP | 2009045077 | 3/2009 |
| JP | 2009119230 | 6/2009 |
| JP | 2009527377 | 7/2009 |
| JP | 2009292167 | 12/2009 |
| JP | 201061959 | 3/2010 |
| JP | 2013177714 | 9/2013 |
| JP | 2014015145 | 1/2014 |
| JP | 2015054564 | 3/2015 |
| JP | 2016510286 | 4/2016 |
| JP | 2016073196 | 5/2016 |
| JP | 201722956 | 1/2017 |
| KR | 20100129652 | 12/2010 |
| KR | 20120001064 | 2/2012 |
| KR | 20140110321 | 9/2014 |
| KR | 20150061894 | 6/2015 |
| KR | 20160089299 | 7/2016 |
| KR | 20180060758 | 6/2018 |
| TW | 201809286 | 3/2018 |
| WO | WO2002103718 | 12/2002 |
| WO | WO2007038950 | 4/2007 |
| WO | WO2011006641 | 1/2011 |
| WO | WO2011012225 | 2/2011 |
| WO | WO2014110323 | 7/2014 |
| WO | WO2015103563 | 7/2015 |
| WO | WO2015103565 | 7/2015 |
| WO | WO2015151595 | 10/2015 |
| WO | WO2016057487 | 4/2016 |
| WO | WO2016170160 | 10/2016 |
| WO | WO2016198969 | 12/2016 |
| WO | WO 2017/003531 | 1/2017 |
| WO | WO2017055685 | 4/2017 |
| WO | WO2017120050 | 7/2017 |
| WO | WO2015001665 | 1/2018 |
| WO | WO2018032026 | 2/2018 |

OTHER PUBLICATIONS

Notice of Allowance of U.S. Appl. No. 16/186,870 dated Nov. 18, 2020, 36 pages.

Notice of Allowance of U.S. Appl. No. 16/396,397 dated Nov. 17, 2020, 19 pages.

Extended European Search Report of EP19797012.2 dated Jan. 20, 2022, 9 pages.

Japanese Office Action of S/N 2020-519661 dated Feb. 9, 2021, 2 pages.

Office Action of U.S. Appl. No. 16/696,833 dated Jun. 8, 2021, 36 pages.

International Search Report and Written Opinion of Serial No. PCT/US2020/023281 dated Jun. 8, 2020, 17 pages.

Office Action of U.S. Appl. No. 15/635,803 dated Jun. 24, 2021, 28 pages.

Extended European Search Report of EP18822996.7 dated Jan. 14, 2021, 8 pages.

Extended European Search Report of EP18825366.0 dated Mar. 2, 2021, 8 pages.

Office Action of U.S. Appl. No. 15/635,803 dated Dec. 9, 2021, 22 pages.

Office Action of U.S. Appl. No. 15/635,803 dated Dec. 24, 2020, 16 pages.

Office Action of U.S. Appl. No. 16/696,833 dated Jan. 11, 2021, 23 pages.

Notice of Allowance of U.S. Appl. No. 16/696,833 dated Sep. 16, 2021, 8 pages.

Office Action of U.S. Appl. No. 15/635,803 dated Jun. 24, 2020, 13 pages.

Office Action of U.S. Appl. No. 16/186,870 dated Aug. 4, 2020, 28 pages.

Office Action of U.S. Appl. No. 16/696,833 dated Aug. 4, 2020, 53 pages.

Notice of Allowance of U.S. Appl. No. 16/396,397 dated Aug. 21, 2020, 16 pages.

Notice of Allowance of U.S. Appl. No. 16/857,548 dated Feb. 9, 2021, 22 pages.

Afzali, A. and SH Maghsoodlou; "Nanostructured Polymer Blends and Composites in Textiles", Nanostructured Polymer Blends and Composites in Textiles (2016): 58. https://books.google.com/books?hl=en&lr=&id=upXwCgAAQBAJ&oi=fnd&pg=PA41&dq=leather+smart_material+OR+intelligent_material++vehicle+OR+automotive+OR+automobile+OR+car+OR+driver+illuminate+OR+color+&ots=EtKF9oClou&sig=dFB_31AgXvteP7vqBtl5R6_lsql#v=onepage&q&f=false.

Cooper, Tyler; "Wireless Inductive Power Night Light." Adafruit. https://learn.adafruit.com/wireless-inductive-power-night-light?view=all.

CSIR-Central Leather Research Institute, "A novel bi-functional leather for smart product applications and a process for the preparation thereof" https://www.clri.org/Patents.aspx?P=22.

Davis, Alex; "Faurecia's Self-Driving Car Seat Knows When You Need a Massage", WIRED; Transportation, Nov. 17, 2015 https://www.wired.com/2015/11/faurecias-self-driving-car-seat-knows-when-you-need-a-massage/.

(56) References Cited

OTHER PUBLICATIONS

Wegene Jima Demisie, Thanikaivelan Palanisamy, Krishnaraj Kaliappa, Phebe Kavati, Chandrasekaran Bangaru; "Concurrent genesis of color and electrical conductivity in leathers through in-situ polymerization of aniline for smart product applications", Feb. 28, 2015 https://onlinelibrary.wiley.com/doi/abs/10.1002/pat.3483.
M. F. Farooqui and A. Shamim; "Dual band inkjet printed bow-tie slot antenna on leather", 2013 7th European Conference on Antennas and Propagation (EuCAP), Gothenburg, 2013, pp. 3287-3290. IEEE Xplorer.
Fukuyama et al.; "Multi-Layered Fabric Electrode for Movement Artifact Reduction in Capacitive ECG Measurement", Conf Proc IEEE Eng Med Biol Soc. 2013;2013:555-8.
S. Griffiths; Daily Mail.com, Sep. 23, 2015, "The smart car seat that tackles Road Rage: Chair gives drivers a relaxing massage or a blast of air to focus their attention" https://www.dailymail.co.uk/sciencetech/article-3246341/The-smart-car-seat-tackles-ROAD-RAGE-Chair-gives-drivers-relaxing-massage-blast-air-focus-attention.html.
Heuer et al.; "Unobtrusive In-Vehicle Biosignal Instrumentation for Advanced Driver Assistance and Active Safety", 2010 IEEE EMBS Conference on Biomedical Engineering and Sciences (IECBES) Nov. 30-Dec. 2, 2010.
J. Hoefler, B. Hageman, E. Nungesser and R. Smith, "High-performance acrylic polymer technology", Leather International, Apr. 22, 2016.
Kindermann, "Automotive—Leather innovation from Wollsdorf—Smart Leather", Mar. 26, 2019, 2 pages.
Rao, S.; "High-definition haptics: Feel the difference!" Texas Instruments Incorporated, Analog Applications Journal 3Q 2012, 6 pages.
Sangeetha et al.; "Stimuli Responsive Leathers Using Smart Retanning Agents", JALCA, vol. 107, 2012.
TDK Group Company, Piezo Haptic Actuator—POwerHapTM, 15G Type, Preliminary data, Jun. 9, 2017, 9 pages.
Wang et al.; "Wireless Power Transfer System in the LED Lighting Application." 2015 12th China International Forum on Solid State Lighting (2015): 120-122.
Wollsdorf Leather, "Medical—Durability for Special applications indoors and outdoors", 2 pages.
Wollsdorf Leder "Wollsdorf Leder in the interior space", 4 pages, https://www.wollsdorf.com/w/en/products/upholstery/services/leder/.
J. Zaklit, Y. Wang, Y. Shen and N. Xi; "Quantitatively characterizing automotive interior surfaces using an Optical TIR-based texture sensor", 2009 IEEE International Conference on Robotics and Biomimetics (ROBIO), Guilin, 2009, pp. 1721-1726., doi: 10.1109/ROBIO.2009.5420440, IEEE Xplore.
International Search Report and Written Opinion of Serial No. PCT/US2018/031583 dated Jul. 20, 2018, 10 pages.
International Search Report and Written Opinion of Serial No. PCT/US2018/031803 dated Jul. 20, 2018, 11 pages.
International Search Report and Written Opinion of Serial No. PCT/US2018/032358 dated Jun. 21, 2018, 10 pages.
International Search Report and Written Opinion of Serial No. PCT/US2019/030130 dated Aug. 30, 2019, 33 pages.
Extended European Search Report of EP19219164.1 dated Jun. 4, 2020, 13 pages.
Japanese Office Action of S/N 2020-519661 dated Oct. 13, 2020, 3 pages.
Notice of Allowance of U.S. Appl. No. 15/635,838 dated Apr. 10, 2020, 17 pages.
Office Action of U.S. Appl. No. 16/396,397 dated Apr. 20, 2020, 59 pages.
Extended European Search Report of EP18823412.4 dated Feb. 26, 2021, 10 pages.
European Office Action of EP19219164.1 dated Feb. 18, 2022, 7 pages.
Office Action of U.S. Appl. No. 15/635,803 dated Aug. 18, 2022, 29 pages.
Office Action of U.S. Appl. No. 17/308,609 dated Mar. 9, 2023, 22 pages.
Notice of Allowance of U.S. Appl. No. 15/635,803 dated Jan. 17, 2023, 9 pages.

* cited by examiner

WIRELESS POWER OF IN-MOLD ELECTRONICS AND THE APPLICATION WITHIN A VEHICLE

CROSS REFERENCE TO RELATED APPLICATION

This application claims priority to U.S. Provisional Patent Application Ser. No. 62/839,461 filed Apr. 26, 2019, which is expressly incorporated herein by reference.

BACKGROUND

Molded parts are used as interior and exterior components of vehicles. However, these molded parts often do not have any functionality. To impart functionality to a vehicle component including the molded part, a functional element is arranged on the molded part to add functionality to the vehicle component. The molded part may require a rather complex structure for accommodating the functional element so as to conceal it from view, protect it from impact, protect it from environmental exposure, etc.

To address these problem, various functional elements may be in-molded into the molded part to add functionality and to conceal and protect the functional element. However, these in-molded functional elements still need to be connected to a power source to activate their functionality, which requires an electrical connection be made between the in-molded functional element and the power source that is external to the molded part. This requires an electrical interface (e.g. electrically conductive wire) extending from inside the molded part where it connects to the functional element, to outside the part where it connects to the power source. Such electrical interfaces include a flex wire that is half in and half out of the molded part. Such electrical interface can also be damaged from impact, environmental exposure, and may be unsightly. Thus precautions are necessary to conceal and protect these electrical interfaces as well.

An additional problem for these electrical interfaces is that the flex wire extending between the inside and outside of the molded part adds a failure point to the electrical connection between the power source and the functional element.

BRIEF DESCRIPTION

According to one aspect, a functional component includes a molded part including a thermoformed first film, a molded polymeric structural layer arranged under the first film, a thermoformed second film arranged under the structural layer, and a printed electronic circuit arranged over the second film and adjacent the structural layer, the electronic circuit including a receiver coil that is inductively couplable to a transmitter coil. The first film is arranged to cover the structural layer, the second film, and the electronic circuit to thereby define an exposed surface of the molded part.

According to another aspect, a functional component includes a thermoformable film including a first side and a second side opposite from the first side; and a printed electronic circuit arranged on the film and including a receiver coil that is inductively couplable to a transmitter coil.

According to another aspect, a method of producing a functional component includes providing a first film and a second film; arranging an electronic circuit, including a receiver coil inductively couplable to a transmitter coil, on the second film; arranging the first film and the second film including the electronic circuit in a mold; and injecting a resin into the mold and curing the resin to form a polymeric structural layer between the first film and the second film. The structural layer is arranged adjacent to the electronic circuit. The first film is arranged to cover the structural layer, the second film, and the electronic circuit to thereby define an exposed surface of the functional component.

According to another aspect, a method of producing a functional component includes providing a thermoformable film; arranging an electronic circuit, including a receiver coil inductively couplable to a transmitter coil, on the film; arranging the film including the electronic circuit in a mold; and injecting a resin into the mold and curing the resin to form a polymeric structural layer adjacent to the electronic circuit.

According to another aspect, method of producing a functional component includes providing a thermoformable film; and printing an electronic circuit, including a receiver coil inductively couplable to a transmitter coil, on the film.

DETAILED DESCRIPTION

Figure 1:
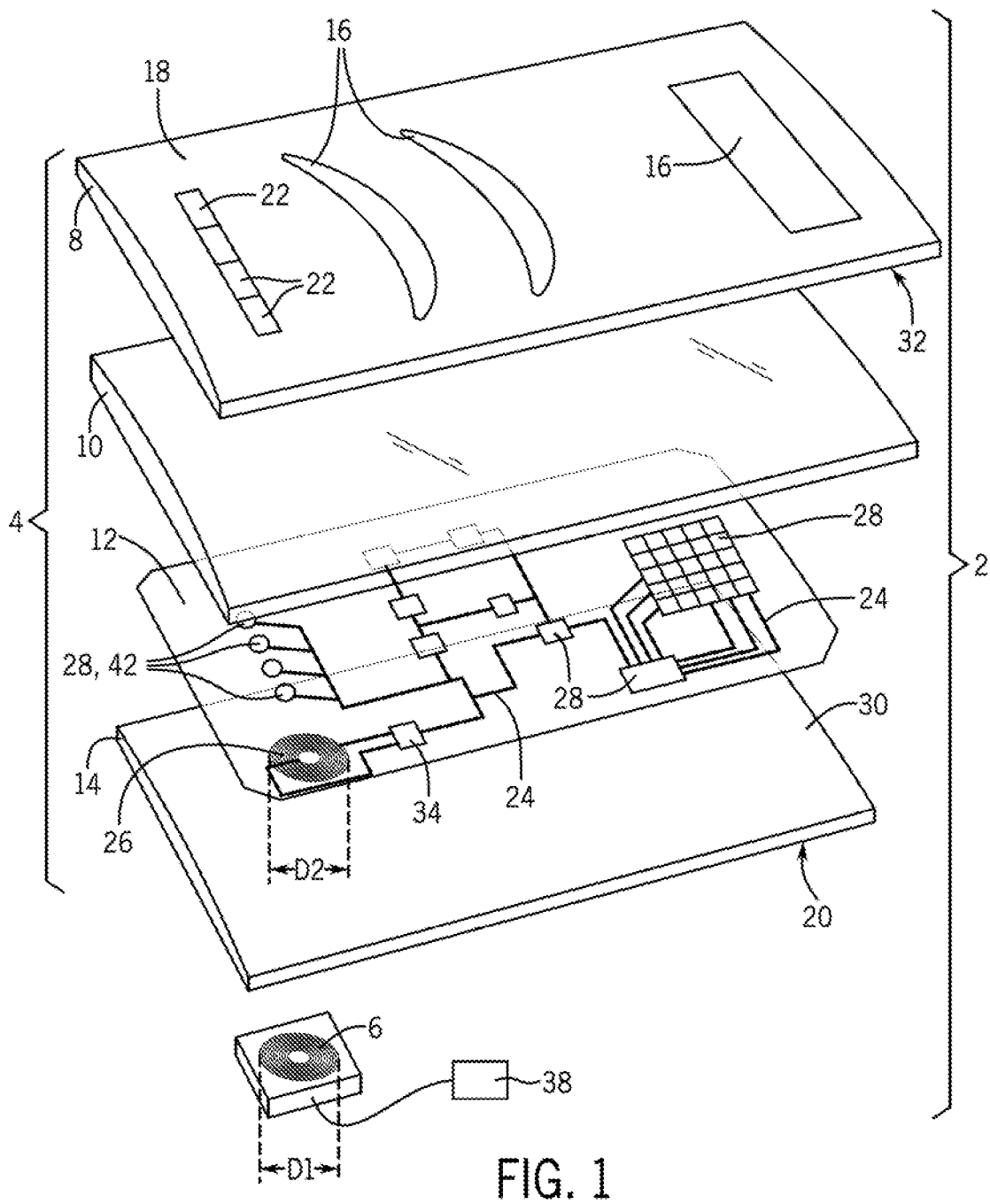
FIG. 1 is an exploded perspective view of a functional component according to the present subject matter.

The present subject matter relates to a wirelessly powered, molded functional component with in-molded electronics. With wireless power, the functional component may not include a flex wire or any other kind of electrical connection sticking half in and half out of the molded part, and may thus eliminate such a failure point.

The wireless powering of the molded component may be achieved by inductive power transfer to the in-molded electronics to enable their functionality. The ability to transmit power to the in-molded electronics will simplify the production process and application of the functional component and eliminate the conventional electrical interface failure point.

In reference to FIGS. 1-12, a functional component 2 is provided. The functional component 2 is not particularly limited in its application, and can be used in vehicle applications or in applications other that in vehicles. For convenience only, and not to limit the use of the functional component 2, it will be referred to herein as a function vehicle component 2. The functional vehicle component 2 includes a molded part 4 and a transmitter coil 6. The molded part 4 includes a first film 8, a molded polymeric structural layer 10, and an in-molded printed electronic circuit 12. The molded part 4 optionally includes second film 14 and graphics 16. The functional vehicle component 2 may be used as an interior or exterior component of an associate vehicle in which the functional vehicle component 2 is included.

The first film 8 and the second film 14 may each be thermoformable, and may include the same or different materials. The first and second films 8, 14 may each include a flat thin-gauged thermoplastic polymer sheet that can be heated to a pliable forming temperature, formed to a specific shape (e.g. in a mold), and cooled to retain the specific shape.

The first and second films 8, 14 may each include acrylic, acrylonitrile butadiene styrene, nylon, polylactic acid, polybenzimidazoles, polycarbonate, polysulfone, polyoxymethylene, polyetherether ketone, polyetherimides, polyethylene, polyphenylene oxide, polyphenylene sulfide, polypropylene, polystyrene, polyvinyl chloride, polytetrafluoroethylene, other thermoplastics, or combinations thereof. The first and second films 8, 14 before being thermoformed, may each have a gauge of less than 1.5 mm. At these gauges, the first and second films 8, 14 are not considered structural films in that they may not support their own shape or the shape of the molded part 4 before or after thermoforming, and instead may bend or otherwise deform when unsupported by the structural layer 10.

Figure 6:
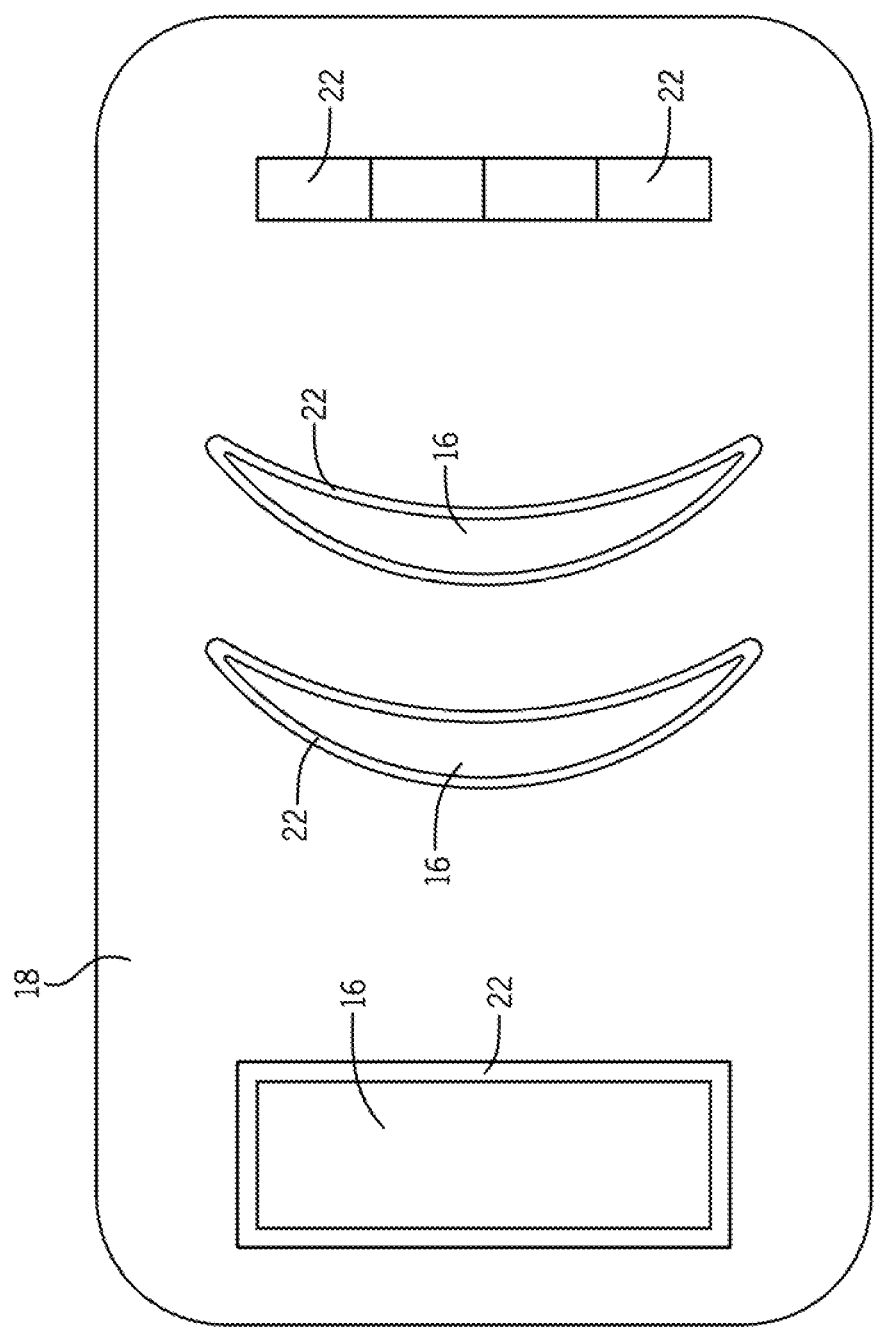
FIG. 6 is a top plan view of a functional component according to the present subject matter.
Figure 7:
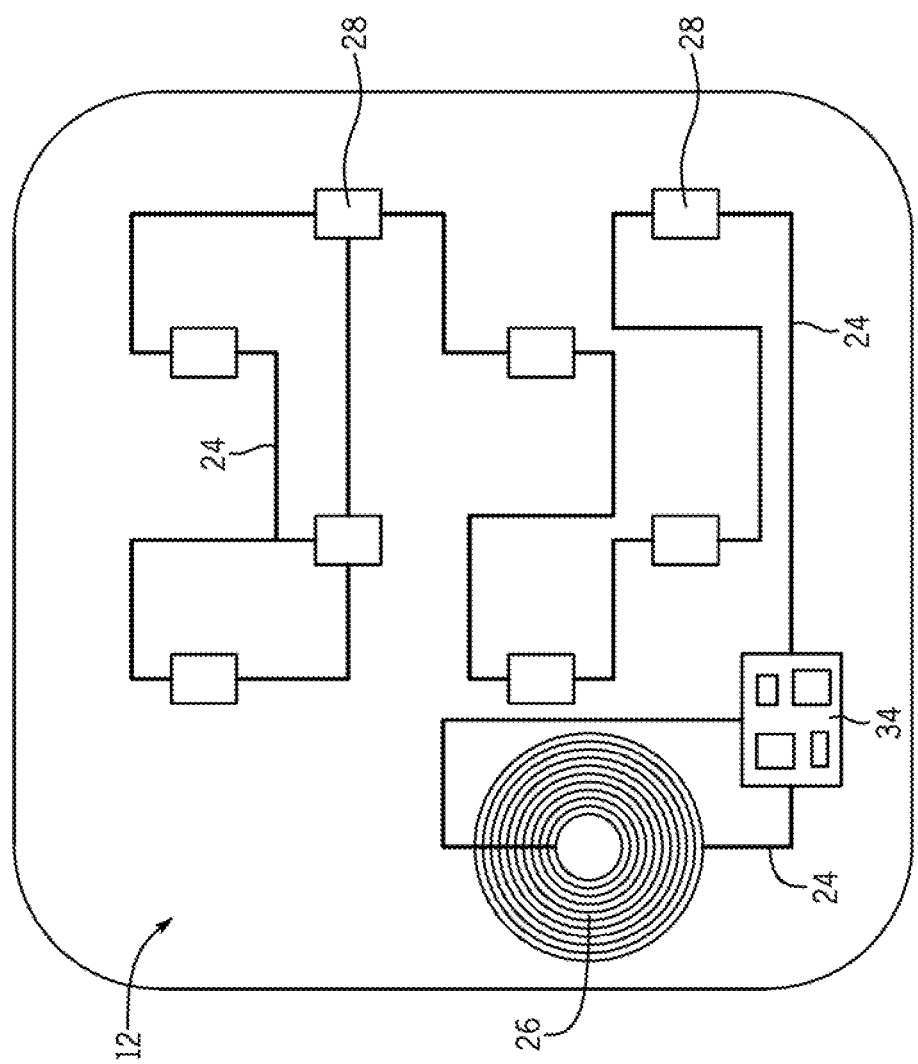
FIG. 7 is a top plan view of a circuit according to the present subject matter.
Figure 8:
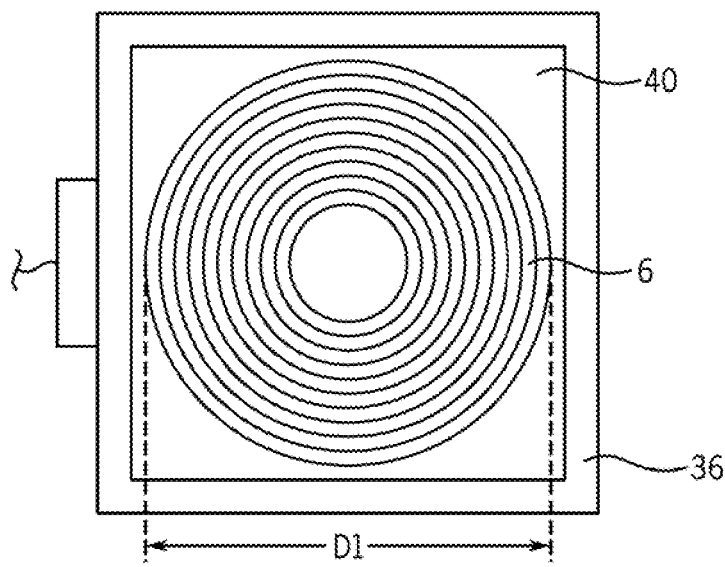
FIG. 8 is a bottom phantom view of a printed circuit board according to the present subject matter.
Figure 9:
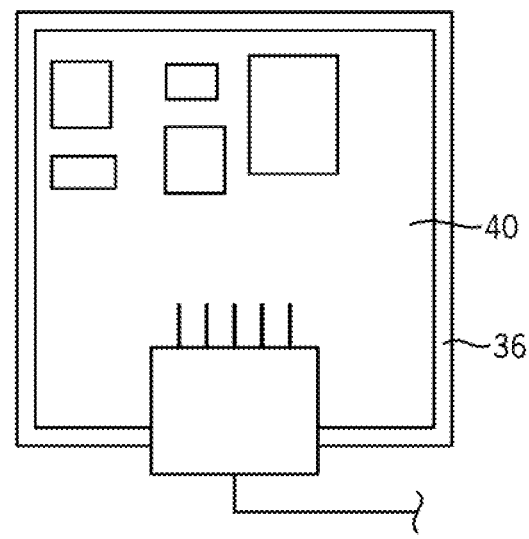
FIG. 9 is a top phantom view of a printed circuit board according to the present subject matter.
Figure 10:
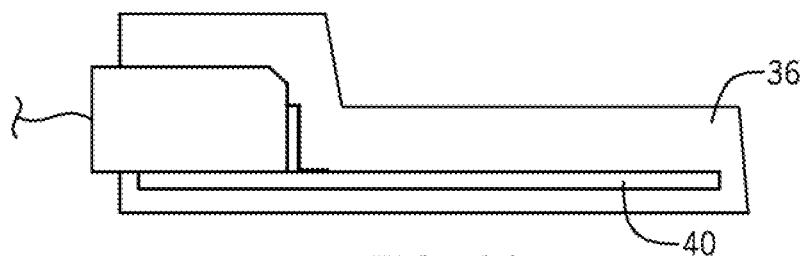
FIG. 10 is a side phantom view of a printed circuit board according to the present subject matter.

The first film 8 is arranged to cover the other components of the molded part 4 (including the circuit 12), and may therefore define an exposed surface 18 of the molded part 4 and the functional vehicle component 2. The exposed surface 18 may be the most visible surface of the functional vehicle component 2 when included as a component of the vehicle. When the functional vehicle component 2 is used as an interior component of the vehicle, the exposed surface 18 may be the outermost surface of the functional vehicle component 2 that is most visible to occupants of the vehicle. When the functional vehicle component 2 is used as an exterior component of the vehicle, the exposed surface 18 may be the outermost surface of the functional vehicle component 2 that is most visible from the exterior of the vehicle. The first film 8 may act as a substrate upon which the electronic circuit 12 is printed (e.g. FIG. 3-4). The first film 8 may be initially flat, and then be made contoured as a result of being thermoformed/molded. As seen in FIGS. 1 and 6, the first film 8 may include viewing features 22 that allow viewing through the first film 8 from the exposed surface 18. Such viewing features 22 may be apertures, thinned areas, or other features in the first film 8 that allows viewing through the first film 8.

If the second film 14 is included in the functional vehicle component 2 (FIGS. 1-2), the second film 14 may be arranged under the other components of the molded part 4, and may define a non-exposed surface 20 of the molded part 4 that is on a side of the molded part 4 opposite from the exposed surface 18. The non-exposed surface 20 may be the innermost surface of the of the molded part 4 that is least visible or not visible at all when the functional vehicle component 2 is included as a component of the vehicle. The second film 14 may be provided as a substrate upon which the electronic circuit 12 is printed. If the second film 14 is not included in the molded part 4, the first film 8 may act as a substrate upon which the electronic circuit 12 is printed. The second film 14 may be initially flat, and then be made contoured as a result of thermoforming/molding.

As used herein, "top," "above," "over," "covers," and similar expressions refers to a direction or position that is up in the FIGS. 1-5 and relatively nearer to the exposed surface 18; while "bottom," "below," "under," "is covered by," and similar expressions will be a direction or position that is down in FIGS. 1-5 and relatively nearer to the non-exposed surface 20.

Figure 2:
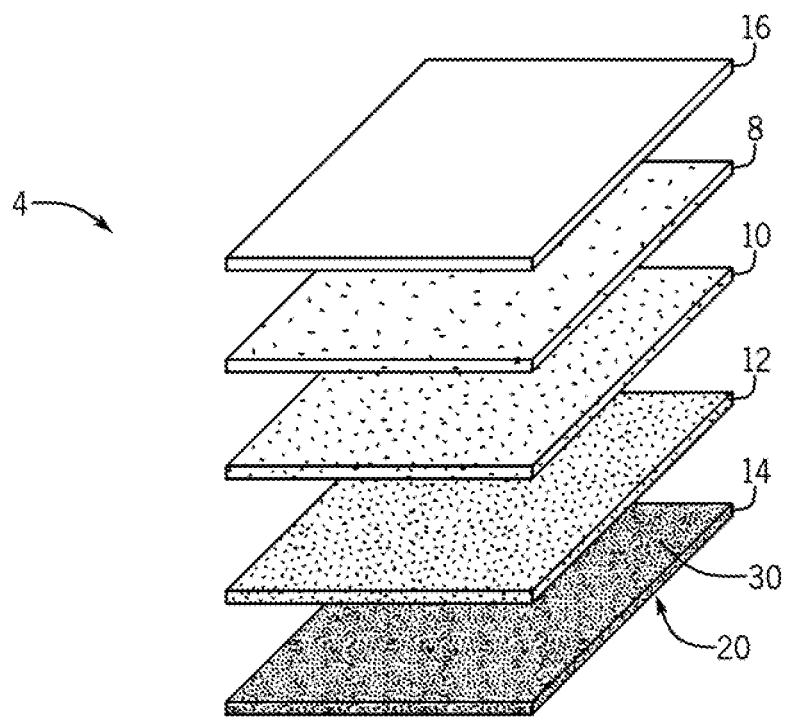
FIG. 2 is a schematic exploded perspective view of a molded part according to the present subject matter.
Figure 4:
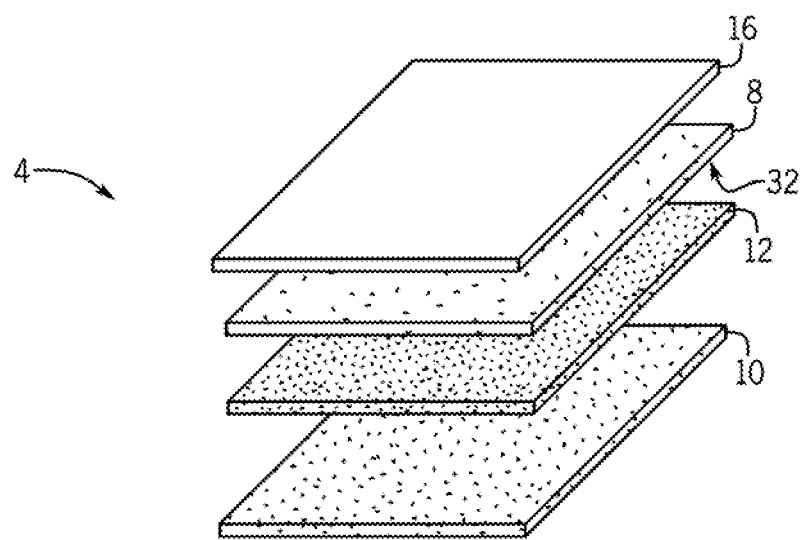
FIG. 4 is a schematic exploded perspective view of another functional component according to the present subject matter.

The structural layer 10 is provided as a structural support for the other components of the molded part 4 and functional vehicle component 2, in order to maintain a shape of the functional vehicle component 2. The structural layer 10 is arranged under, and is covered by, the first film 8, and may be arranged over, and thus covering, the second film 14 if included. The structural layer 10 is arranged adjacent to, and may contact, the circuit 12. In FIGS. 1-2, the structural layer 10 is arranged over the circuit 12 and second film 14, and as such, the structural layer 10 may be transparent. In FIG. 4, the structural layer 10 is arranged under the circuit 12 and no second film 14 is included. The functional vehicle component 2 is not limited to configurations wherein only a single side of the structural layer 10 includes one or more circuits 12, as the structural layer 10 may be provided with one or more circuits 12 on each side of the structural layer 10. In a non-limiting example, the functional vehicle component 2 may include a combination of the circuit 12 over the structural layer 10 and under the structural layer 10. The structural layer 10 may have a thickness of more than 3 mm in order to provide structural support for the molded part 4. At these thicknesses, the structural layer 10 may be able maintain its own shape, even if not supported by other components or material, and may be able maintain the shape of the other components of the functional vehicle component 2.

The structural layer 10 may include a molded polymer that is formed by curing a resin material. The polymer may include a variety of thermoplastics, thermosets, or combinations thereof. The structural layer 10 may include other materials such as fillers, reinforcements (e.g. fibers of glass or aramid), other additional layers, etc., or combinations thereof. In a non-limiting embodiment, the structural layer 10 includes a thermoplastic polymer that is cured by cooling a molten resin material. The structural layer 10 may be coextensive with the first film 8 and/or the second film 14.

The electronic circuit 12 is included to provide functionality to the functional vehicle component 2. The circuit includes one or more flexible conductive traces 24, a receiver coil 26 electrically connected to the traces 24, and one or more electronic elements 28 electrically connected to the traces 24. Although the circuit 12 is depicted in the figures as being a continuous layer, this is only for convenience in order to show the arrangement of the various elements of the molded part 4, and it will be understood that the circuit 12 may or may not comprise voids between conductive traces 24, the receiver coil 26, and the electronic elements 28, and therefore the circuit 12 may or may not be a continuous layer as depicted.

Figure 3:
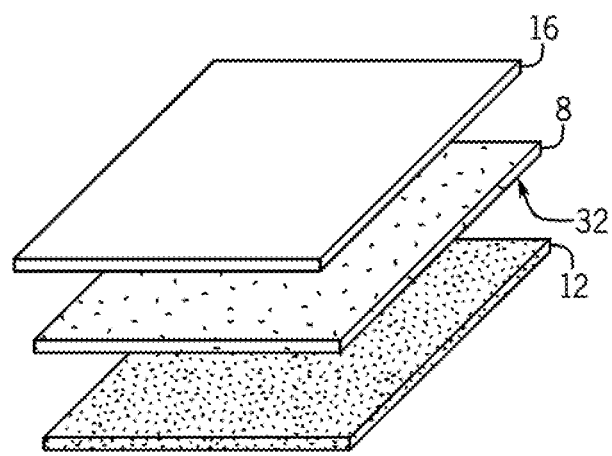
FIG. 3 is a schematic exploded perspective view of a portion of a molded part before a molding process according to the present subject matter.

The circuit 12 may be printed on the top surface 30 of the second film 14 (FIGS. 1-2), or on a bottom surface 32 of the first film 8 (FIGS. 3-4). The circuit 12, including the receiver coil 26 and electronic elements 28, may be flexible and therefore may conform to the contours of the thermoformed first or second films 8, 14. By "flexible", it is meant a layer, circuit, trace or other element or material that is not rigid, brittle, or stiff, and instead bends, stretches, changes shape, or otherwise yields to external forces, yet does not break or lose functionality when subject to such external forces. When referring to the "flexible electronic circuit", it is meant that the electronic circuit 12 does not break and retains its conductivity even when bent, stretched, twisted or otherwise deformed to a strain of 1% to at least 35%.

In one embodiment, the molded part 4 includes only one electronic circuit 12. In another embodiment, the molded part 4 includes more than one electronic circuit 12, for example, two, three or more electronic circuits 12. When more than one circuit 12 is included in the molded part 4, each individual circuit 12 may be configured to perform a different function than the other circuits 12, which may mean that each circuit 12 is electrically isolated/separated from the other circuits 12, or the circuits 12 can be independently operated, or each circuit 12 can function separately from the other circuits 12, or the circuits 12 are electrically connected to different types of electronic elements 28.

Figure 5:
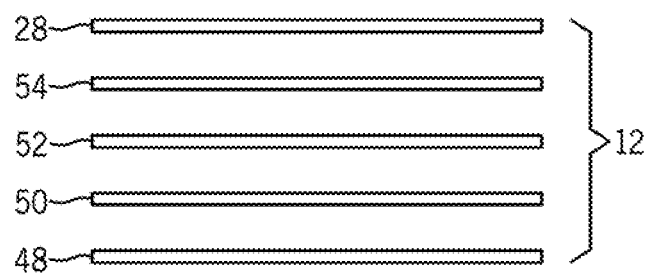
FIG. 5 is a schematic exploded side view of a printed circuit according to the present subject matter.

As depicted in FIG. 5, the circuit 12 may formed with application of a graphic ink layer 48, a conductive ink layer 50, a dielectric ink layer 52, a conductive adhesive layer 54, and the electronic elements 28. The graphic ink layer 48 may be included to provide a desired visual appearance to the functional vehicle component 2, for example, a part of the circuit 12 that may be visible through the viewing features 22. The conductive ink layer 50 may be used to form the conductive traces 24. The dielectric ink layer 52 may be used to insulate the conductive traces 24. The conductive adhesive layer 54 may be used to adhere and electrically connect various electronic elements 28 to the conductive traces 24, such as light emitting diodes or other pick-and-place surface mounted electronic elements 28 that are not printed electronic elements 28, for example.

The circuit 12 includes a receiver coil 26 and a printed circuit board 34, both of which may be flexible. The receiver coil 26 may be inductively coupled to the transmitter coil 6, which may be arranged in a connecting box 36 that is electrically connected to a power source 38. The connecting box 36 may be waterproof for exterior applications of the functional vehicle component 2. The power source 38 may external to the functional vehicle component 2, such as a power source (e.g. battery, alternator or engine) associated with the vehicle, for example.

Figure 11:
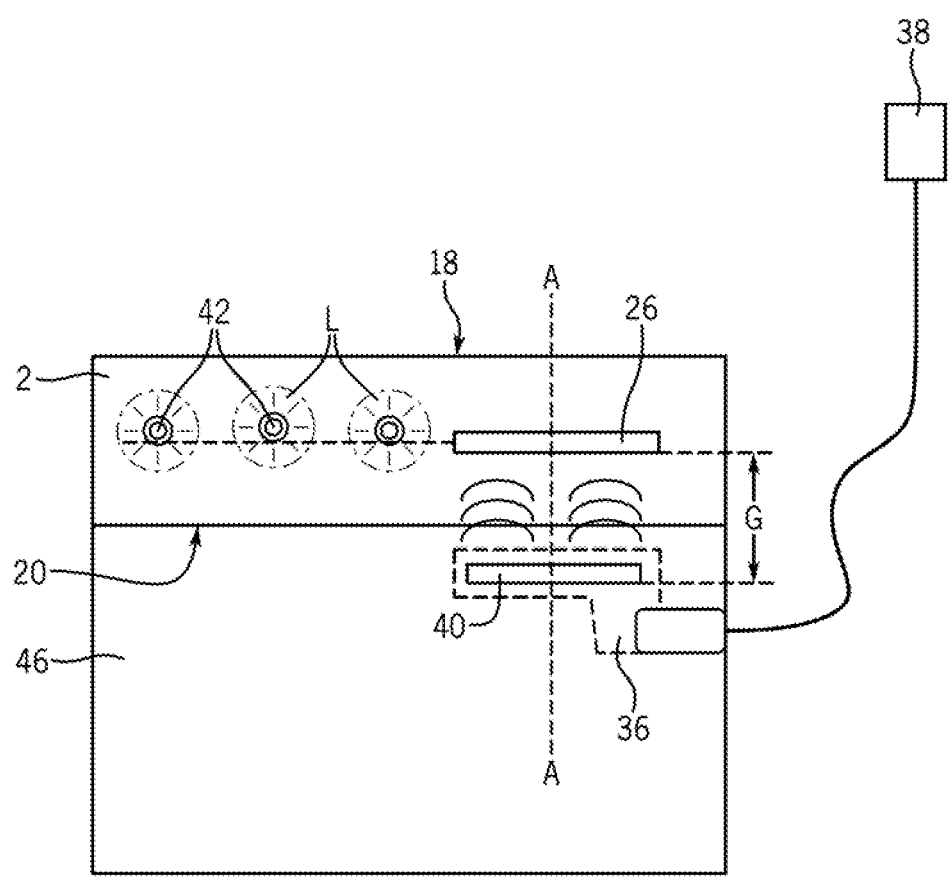
FIG. 11 is a side is a side cross-sectional view of a functional component and substrate according to the present subject matter.

The transmitter coil 6 may be printed on a second printed circuit board 40, which may be arranged in the connecting box 36. As depicted in FIG. 11, the connecting box 36 itself may be arranged on an underlying substrate 46, upon which the functional vehicle component 2 may also be arranged.

When power from the power source 38 is delivered to the transmitter coil 6, the transmitter coil 6 transmits power by inductive coupling to the receiver coil 26, which delivers electric current to the circuit 12. The transmitter coil 6 and the receiver coil 26 are configured such that a change in current through the transmitter coil 6 induces a voltage across the ends of the receiver coil 26 through electromagnetic induction. A changing current through the transmitter coil 6 creates a changing magnetic field around it by Ampere's circuital law. The changing magnetic field induces an electromotive force (EMF or voltage) in the receiver coil 26 by Faraday's law of induction. The amount of inductive coupling between the transmitter coil 6 and the receiver coil 26 may be measured by their mutual inductance. The coupling between the transmitter coil 6 and the receiver coil 26 may be achieved by arranging the transmitter coil 6 and the receiver coil 26 to be separated by a gap (G) that is equal to or smaller than a diameter (D1) of the transmitter coil 6 or a diameter (D2) of the receiver coil 26, and where the transmitter coil 6 and the receiver coil 26 are arranged on a common axis (A). This may allow the magnetic field of the transmitter coil 6 to pass through the receiver coil 26 by a short-range near-field non-radiative inductive coupling, as opposed to a mid-range near-field resonant inductive coupling (which has the transmitter coil and the receiver coil separated by a gap (G) that is between 1 and 10 times the diameter (D1) of the transmitter coil 6 or a diameter (D2) of the receiver coil 26, and as opposed to far-field radiative wireless power transfer.

By this arrangement, electric current can be delivered wirelessly into the molded part 4 to power the electronic elements 28 of the circuit 12. This wireless delivery of power to the circuit 12 may eliminate the need for a "pig tail" electrical connection to be included as part of the molded part 4 for connecting the molded part 4 to the external power source 38. Such pig tail connections can require a flat wire cable that is half in and half out of the molded part 4 for hard wire connection to the circuit 12, and thus introduces potential mechanical failure points for the delivery of electrical power to the circuit 12, and would be an added cost for producing such an assembly. The delivery of electric current from the power source 38 to the circuit 12 by inductive coupling does not require mechanical attachment to the molded part 4. This allows the molded part 4 to be assembled without a pig tail connector and flat wire cable that is half in and half out of the molded part 4. This presents a clean and unobstructed exterior to the molded part 4 allowing for easy movement and manipulation of the molded part 4, without having to worry about damaging a pig tail connector or flat wire cable.

The one or more circuits 12 (including one or more conductive traces 24, the electronic elements 28, and the receiver coil 26) may be formed using an electrically conductive ink that includes a binder (e.g. polymer material such as polyimide) and conductive particles, including for example, copper, ferromagnetic material, silver, carbon, silver chloride, or other electrically conductive particles. The one or more circuits 12 may be formed by applying, e.g. printing, a conductive ink directly on the first film 8 and/or the second film 14, followed by curing, drying, hardening, etc. of the conductive ink, to thereby form the conductive traces 24, the receiver coil 26, and electronic elements 28 of the circuits 12. In other words, the conductive traces 24, the receiver coil 26, and electronic elements 28 may be defined by or include a printed and cured conductive ink. Conductive inks that are suitable to create the one or more circuits 12 and electronic elements 28 and the receiver coil 26 thereof are not particularly limited, and may include for example, PE671, PE773, PE873, and PE971 Stretchable Conductors, PE410 Ink-Jet Silver Conductor, 5021, 5025, 5028, and 5064HY Ag Conductors, ME601 and ME602 Stretchable Silver Conductors, PE827 and PE828 Ultra-Low Temperature Cure Silver Composite Conductors, Kapton™ KA801 Polyimide Silver Conductor, available from E. I. du Pont de Nemours and Company; and CI-1036, CI-4040, CI-2051, and CI-1062 Stretchable Conductive Ink available from Engineered Materials Systems, Inc. (EMS).

These conductive inks can be applied on the first film 8 and/or second film 14 by any method including pad-printing, flexography, rotogravure, spraying, dipping, syringe dispensing, stenciling, screen printing, aerosol jet printing, or inkjet printing for example in order to create an electronic circuit. The flexible electronic circuits 12 can be formed using other materials or processes including etching, in-mold forming of the electronic circuits 12, selective photo-curing, and circuit scribe, for example. In one illustrative embodiment, the one or more circuits 12 are formed by screen printing a conductive ink on the first film 8 and/or second film 14.

The electronic circuit 12 may include one or more electronic elements 28 including a light source 42, sensor 44, auxiliary power sources, capacitors, inductors, diodes, resistors, transformers, switches, other electrical loads, fuses, antennas, wireless transmitters, heaters, etc., each of which may be flexible. However, it will be understood that these or other electronic elements 28 may be included in electrical communication with the circuits 12, but arranged elsewhere other than as part of the circuit 12.

Figure 12:
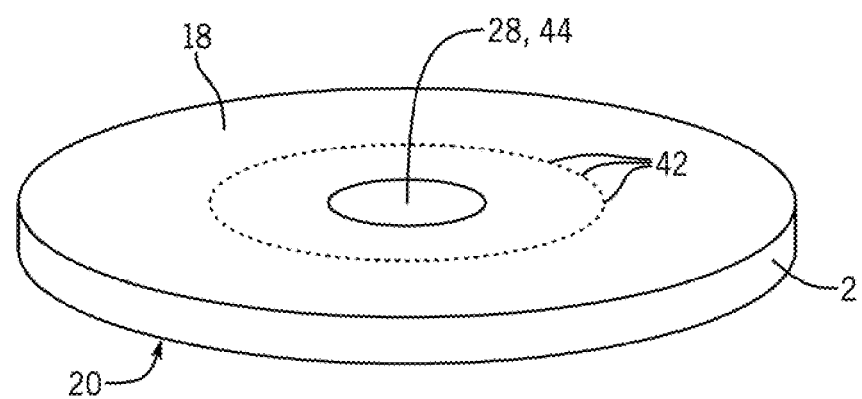
FIG. 12 is a perspective view of a functional component according to the present subject matter.

In one non-limiting example, the light source 42 is included as an electronic element 28 in the functional vehicle component 2. In another non-limiting example and as shown in FIG. 12, a sensor 44 is included as an electronic element 28 in the functional vehicle component 2 along with a light source 42 to indicate its position and/or functioning.

The light source 42 is not limited in any way and can include luminescent light sources (e.g. electroluminescent, photoluminescent, mechanoluminescent light sources), and incandescent light sources. Illustrative examples of the light source 42 include a light emitting diode (LED), an organic light emitting diode (OLED), or a photoluminescent or electroluminescent light source configured in a film or sheet. In a non-limiting example, the light source 42 comprises LEDs having a light emitting area with a size of 100 μm×100 μm (i.e. 100 μm diameter) or less, herein referred to micro-LEDs. A micro-LED is a light source that includes an array of one or more individual light emitters, wherein an array may have a diameter of about 2 μm-20 mm and the individual light emitters have typical diameters of about 2-20 μm. In one aspect, the one or more micro-LEDs are arranged as part of the electronic circuit 12.

In an embodiment, graphics 16 may be arranged over the first film 8 on the exposed surface 18 of the functional vehicle component 2 so as to be visible from the exposed surface 18. Although the graphics 16 are depicted in FIGS. 2-4 as being a continuous layer, this is simply for convenience, and it should be understood that the graphics 16 may or may not be a continuous layer. The graphics 16 and/or the first film 8, may at least partially conceal or camouflage the circuit 12 including the flexible conductive traces 24, the receiver coil 26, the electronic elements 28, and the printed circuit board 34. The graphics 16 and/or the first film 8 may also conceal or camouflage the structural layer 10 and the second film 14. The graphics 16 are not particularly limited by the present subject matter, and may include a translucent or opaque layer, film, ink, or coating arranged over the flexible circuit 12. By "translucent" it is meant a material or layer that allows light to pass therethrough, but causes sufficient diffusion to prevent perception of distinct images through the material or layer. In another embodiment, the graphics 16 are not included, or the graphics 16 are clear (i.e. optically transparent) and/or the circuit 12 and electronic elements 28 thereof are positioned on top of the graphics 16.

In a non-limiting example, the graphics 16 and/or the first film 8 produce sufficient diffusion of light such that visibility through the graphics 16 and or first film 8, of the flexible electronic circuit 12 and all the electronic elements 28 of the circuit 12, except for light (L) emitted by the light source 42, is inhibited by the graphics 16 and/or first film 8. In one embodiment, the flexible electronic circuit 12 and all the electronic elements 28 of the circuit 12 may not be visible through the graphics 16 and/or first film 8. The light source 42 is also under the graphics 16 and the first film 8, and therefore visibility of the light source 42 through the graphics 16 and/or first film 8 may be inhibited by the graphics 16 and/or first film 8. In one embodiment, the light source 42 may not be visible through the graphics 16 and/or first film 8. However, the graphics 16 and/or first film 8 are sufficiently translucent (rather than being opaque) such that light (L) emitted by the light source 42 is visible through the graphics 16 and/or first film 8. Accordingly, the graphics 16 and/or first film 8 at least in some measure conceals the flexible circuit 12 (including the light source 42) from view, yet allows light (L) emitted from the light source 42 to be transmitted therethrough so that the emitted light is visible through the graphics 16 and the first film 8. Light (L) emitted from the light source 42 that is transmitted through the graphics 16 and/or first film 8 may be used for illumination or as a visual indicator to convey information.

In one embodiment, the first film 8 includes viewing features 22 that allow viewing of the emitted light (L) from the light source 42. Such viewing features 22 may be arranged above the light source 42 to allow the emitted light (L) to be seen from the exposed surface 18. The first film 8 may be transparent, and thus allows emitted light (L) to be transmitted therethrough. In this aspect, the graphics 16 may not cover areas of the first film 8 above the light source 42 to thereby define the viewing features 22 and allow emitted light (L) to be seen from the exposed surface 18 through the viewing features 22.

The graphics 16 may be an ink, polymer, textile, composite material, enamel, paper, glass, metal, ceramic, other material, and combinations thereof. In one non-limiting example, the graphics 16 comprises a pigmented ink including for example a mixture of polymer and pigment particles. The polymer may be an acrylic urethane resin for example. The graphics 16 may be formed by applying the ink as a liquid over the first film 8 and curing the polymer in the ink to produce the graphics 16. The graphics 16 may have a pigment loading and/or thickness sufficient to inhibit or prevent the circuit 12 from being visible through the graphics 16. However, the graphics 16 may be sufficiently translucent, as opposed to being opaque, such that light (L) emitted by the light source 42 can be seen through the graphics 16. In one non-limiting embodiment, the graphics 16 have a thickness on the first film 8 from 5-50 μm, 15-40 μm, or 20-30 μm.

Operation of the functional vehicle component 2, the electronic circuits 12, and the associated electronic elements 28, may correspond to signals or data derived from one or more electronic systems of a vehicle or may be continuously activated during operation of the vehicle. The data or signals may be accessed from, sensed by, generated by, or otherwise acquired from, or produced by, one or more of the vehicle electronic systems.

In an embodiment, the molded part 4 may include the printed circuit board ("PCB") 34 for controlling the supply of electric current from the receiver coil 26 to the electronic elements 28 via the conductive traces 24. The PCB 34 may be programed or may communicate via a wireless transmitter with the one or more electronic systems of the vehicle, which communication may be for determining when to provide electrical current to, and thus activate, the various electronic elements 28. The PCB 34 may also include a rectifier to convert alternating current from the receiver coil 26 to direct current delivered to the various electronic elements 28.

Further, the functional vehicle component 2, the electronic circuits 12, and the associated electronic elements 28, may provide signals or data to the one or more electronic systems of the vehicle via the PCB 34. For example and as described in more detail herein, the functional vehicle component 2 may include a sensor 44 and signals from the sensor 44 may be communicated to the vehicle electronic systems via the PCB 34, and these signals may be used to operate other electronic elements 28 in the functional vehicle component 2 or to operate various operations of the vehicle. The sensor 44 is not particularly limited, and can include a sensor having any configuration including those that can sense pressure, movement, temperature, proximity, location, speed, velocity, acceleration, tilt, motion, humidity, light, biometrics of a vehicle occupant, etc.

The vehicle electronic systems from which this data or these signals are derived, or to which this data or these signals are communicated, are not particularly limited and may include one or more vehicle electronic control units (ECU's) associated with a vehicle engine, transmission, body, chassis, passive and active safety features, vehicle performance, driver assistance, interior and exterior environment, vehicle diagnostics, vehicle control, audio/visual entertainment, navigation, electrical systems, telematics, and combinations thereof. The vehicle electronic systems can include a door control unit, engine control unit, electric power steering control unit, human-machine interface (HMI), powertrain control module, transmission control unit; seat control unit, speed control unit, telematics control unit, transmission control unit, brake control module (ABS or ESC), battery management system, central control module, central timing module, general electronic module, body control module, suspension control module, or combinations thereof.

In a non-limiting example, the one or more flexible electronic circuits 12 are in communication with a vehicle electronic control unit (ECU), which may control, via communication with the PCB 34, operation of the functional vehicle component 2, the electronic circuits 12, and the associated electronic elements 28.

In another non-limiting example, the one or more circuits 12 are in communication, via the PCB 34, with a human machine interface (HMI), which may be used to control functioning of the functional vehicle component 2, the electronic circuits 12, and the associated electronic elements 28. Such arrangement could allow a user to provide input through the HMI to selectively activate the circuits 12 and associated electronic elements 28. Such user input may be active (user initiated) or passive (sensed input from a user), and can include audible or tactile input. For example, the system may be configured to allow a user to audibly select operation of the functional vehicle component 2, the electronic circuits 12, and the associated electronic elements 28.

As depicted in FIGS. 11 and 12, the functional vehicle component 2 may include one or more light sources 42, which are powered by inductive coupling between the transmitter coil 6 and the receiver coil 26. The light sources 42 may be arranged in relation to another electronic element 28, e.g. a sensor 44, such that light (L) emitted by the light sources 42 indicate a location and/or functioning of electronic element 28. In an exemplary embodiment, the electronic element 28 includes a motion sensor 44 (e.g. a kick sensor) and light sources 42. The light sources 42 may be arranged with respect to the sensor 44 such that they emit light (L) to indicate a location of the sensor 44 (see FIG. 12 for example) so that although the sensor 44 is not visible through the graphics 16 and/or first film 8, a location of the sensor 44 in the functional vehicle component 2 can be determined. The light sources 42 may also/alternatively emit light (L) to indicate that the sensor 44 has detected motion. Such detected motion may cause the sensor 44 to generate a signal, which can be transmitted to a vehicle system via a wireless communication transmitter in the circuit 12, in order to actuate the opening or closing of a door of the vehicle, or other function.

The functional vehicle component 2 may be produced by preparing the molded part 4, and arranging the transmitter coil 6 on the molded part 4 such that the receiver coil 26 is inductively coupled to the transmitter coil 6.

The molded part 4 may be prepared by performing steps including providing a film (either the first film 8 or the second film 14), and arranging the electronic circuit 12, including the receiver coil 26, on the film. The circuit 12 may be printed on the surface of the film or otherwise applied to the film. In one aspect, the circuit 12 is printed on the film using a conductive ink. The film and the circuit 12 are then arranged in a mold to undergo a molding process to form the molded part 4.

If the circuit 12 is arranged on the first film 8 (FIGS. 3-4), then use of the second film 14 is not necessary to produce the molded part 4 since the first film 8 will support the circuit 12 during the molding process. However, if the second film 14 is being include nonetheless in the molded part 4, then the second film 14 may also be arranged in the mold along with the first film 8 and the circuit 12. If the circuit 12 is arranged on the second film 14 however, then the first film 8 may also be arranged in the mold along with second film 14 and the circuit 12. If both the first and second films 8, 14 are being included in the molded part 4, then the circuit 12 may be arranged between the first film 8 and the second film 14. The first and second films 8, 14 and the circuit 12 may be flat before being arranged in the mold.

The mold may be an injection mold, and the liquid resin material may then be injected into the mold and cured to form a solid polymer as the structural layer 10 to thereby form the molded part 4. The resin material may be a thermosetting polymer or a thermoplastic polymer. If the resin is a thermosetting polymer, the mold may be heated to cure the thermosetting polymer. If the resin is a thermoplastic polymer, then the resin may be heated to be in molten form prior to introduction into the mold. The heat from curing a thermoplastic polymer or from the molten thermosetting polymer may cause heating of the first and second films 8, 14 so that they are at a pliable forming temperature. When at a pliable forming temperature, the first and second films 8, 14, may be conformed during the molding process to a desired contoured shape of an interior portion of the mold. Upon cooling of the cured solid polymer, the structural layer 10 is formed, and the thermoformed first and second films 8, 14 may retain a contoured shape, e.g. as depicted in FIG. 1. In this way, the mold determines the shape of the molded structural layer 10, which determines the shape of molded part 4. The first and second films 8, 14 may be thermoformed from a flat arrangement (e.g. FIG. 3) to have a contoured shape, such as that of the molded part 4. The cured polymer of the structural layer 10 may hold together the various other elements/layers of the molded part 4; and the structural layer 10 gives shape, form, and rigidity to the molded part 4.

The first film 8, second film 14, and the circuit 12 may be flat before being thermoformed in the molding process as depicted in FIG. 3, and may be thermoformed during the molding process to have a contoured shape as shown in FIG. 1. Although the various layers of the molded part 4 are shown to be flat in FIGS. 2 and 4, this is not necessary, and the various layers may be contoured as shown in FIG. 1.

The resin may be injected into the mold such when it cures, the structural layer 10 is arranged adjacent the circuit 12, or such that one or more layers or materials separate the structural layer 10 from the circuit 12. The structural layer 10 may be arranged between the first film 8 and the second film 14.

After the molded part 4 is formed, the transmitter coil 6 may be arranged on the molded part 4 such that the receiver coil 26 is inductively coupled to the transmitter coil 6. The transmitter coil 6 may be arranged on the second PCB 40, which itself may be arranged in the connecting box 36. The connecting box 36 may be arranged on the non-exposed surface 20 of the molded part 4 or in a substrate 46, such that the connecting box 36 will be hidden from view when the functional vehicle component 2 is arranged on a vehicle. The transmitter coil 6 may be arranged on the same axis (A) as the receiver coil 26 and within a radius (R1 or R2) of the receiver coil 26.

The transmitter coil 6 may be electrically connecting to the power source 38 of the associated vehicle. A delivery of power from the power source 38 to the transmitter coil 6 may provide a supply of electric current to the electronic circuit 12 by inductive coupling between the transmitter coil 6 and the receiver coil 26.

The transmitter part could be made water proof for the exterior applications. This same transmitter could be used throughout the vehicle to transmit power into all the lighting parts. A more complex transmitter could communicate through the coil to the in-mold also without having Bluetooth transmission.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A functional component comprising:
a substrate;
a transmitter coil; and
a molded part that includes:
  a thermoformed first film;
  a molded polymeric structural layer arranged under the first film;
  a thermoformed second film arranged under the structural layer; and
  a printed electronic circuit arranged over the second film and adjacent the structural layer, the electronic circuit including a receiver coil that is inductively couplable to the transmitter coil to thereby wirelessly supply electric current to the electronic circuit by inductive coupling between the transmitter coil and the receiver coil;
wherein the first film is arranged to cover the structural layer, the second film, and the electronic circuit to thereby define an exposed surface of the molded part;
wherein the functional component does not include a mechanical electrical interface for making an external wired electrical connection with the electronic circuit;
wherein the transmitter coil arranged with respect to the molded part such that the receiver coil is inductively coupled to the transmitter coil;
wherein the transmitter coil is arranged on a side of the molded part opposite from the exposed surface;
wherein the transmitter coil is electrically connected to a power source;
wherein a delivery of power from the power source to the transmitter coil provides the supply of the electric current to the electronic circuit; and
wherein the transmitter coil is arranged in the substrate upon which the molded part is arranged.

2. The functional component according to claim 1, wherein:
the electronic circuit further comprises a printed circuit board including a rectifier that converts alternating current from the receiver coil to direct current; and
the printed circuit board controls the supply of the electric current to the electronic circuit.

3. The functional component according to claim 1, wherein:
the electronic circuit further includes a light source that emits light when supplied with the electric current;
the first film is arranged over the light source; and
light emitted by the light source is visible through the first film.

4. The functional component according to claim 3, wherein:
the light source comprises a micro light emitting diode;
the electronic circuit further includes an electronic element other than the light source; and
the light emitted by the light source indicates at least one of a location and a functioning of the electronic element.

5. The functional component according to claim 3, wherein the molded part includes printed graphics visible at the exposed surface of the molded part, and viewing features comprising apertures, thinned areas, or areas of the first film not covered by the printed graphics, and through which the light from the light source is emitted.

6. A method of producing a functional component, comprising:
producing a molded part by:
  providing a thermoformable film;
  arranging on the film an electronic circuit including a receiver coil that is inductively couplable to a transmitter coil to thereby wirelessly supply electric current to the electronic circuit by inductive coupling between the transmitter coil and the receiver coil;
  arranging the film including the electronic circuit in a mold; and
  injecting a resin into the mold and curing the resin to form a polymeric structural layer adjacent to the electronic circuit;
wherein the molded part does not include a mechanical electrical interface for making an external wired electrical connection with the electronic circuit;
wherein the method further comprises:
  arranging the transmitter coil with respect to the molded part such that the receiver coil is inductively coupled to the transmitter coil, and
  electrically connecting the transmitter coil to a power source of an associated vehicle;
wherein the film is a second film;
wherein the step of producing the molded part further comprises:
  providing a first thermoformable film, and arranging the first film in the mold with the second film before injecting the resin into the mold;

wherein the structural layer is arranged between the first film and the second film; and wherein the first film is arranged to cover the structural layer, the second film, and the electronic circuit to thereby define an exposed surface of the molded part;

wherein the molded part includes a non-exposed surface opposite from the exposed surface;

wherein the transmitter coil is arranged at the non-exposed surface;

wherein a delivery of power from the power source to the transmitter coil provides the supply of the electric current to the electronic circuit;

wherein the electronic circuit further includes a light source that emits light when supplied with the electric current;

wherein light emitted by the light source is visible at the exposed surface;

wherein the molded part includes printed graphics visible at the exposed surface of the molded part;

wherein at least one of the printed graphics and the first film camouflage the electronic circuit;

wherein light emitted by the light source is visible through the at least one of the printed graphics and the first film; and wherein the molded part includes viewing features comprising apertures, thinned areas, or areas of the first film not covered by the printed graphics, and through which the light from the light source is emitted.

7. The method according to claim 6, wherein:

the electronic circuit further comprises a printed circuit board including a rectifier that converts alternating current from the receiver coil to direct current; and the printed circuit board controls the supply of electric current from the receiver coil to the electronic circuit.

8. The method according to claim 6, wherein:

the light source comprises a micro light emitting diode;

the electronic circuit further includes an electronic element other than the light source; and the light emitted by the light source indicates at least one of a location and a functioning of the electronic element.

9. The method according to claim 6, wherein the transmitter coil is arranged in a substrate, and wherein the method further comprises arranging the functional component on the substrate to thereby inductively couple the receiver coil with the transmitter coil.

* * * * *